United States Patent [19]

Heeren

[11] 4,219,925
[45] Sep. 2, 1980

[54] METHOD OF MANUFACTURING A DEVICE IN A SILICON WAFER

[75] Inventor: Richard H. Heeren, Palatine, Ill.

[73] Assignee: Teletype Corporation, Skokie, Ill.

[21] Appl. No.: 939,141

[22] Filed: Sep. 1, 1978

[51] Int. Cl.$^2$ ............................................. B01J 17/00
[52] U.S. Cl. ...................................... 29/578; 29/571; 29/590; 357/23; 357/59
[58] Field of Search ................ 29/571, 578, 589, 590; 357/59, 23

[56] References Cited

U.S. PATENT DOCUMENTS

| | | |
|---|---|---|
| 3,714,525 | 1/1973 | Brown. |
| 3,752,711 | 8/1973 | Kooi. |
| 3,852,104 | 12/1974 | Kooi. |
| 3,909,318 | 9/1975 | Le Can .................................. 29/578 |
| 3,964,092 | 6/1976 | Wadham. |
| 4,008,107 | 2/1977 | Hayasaka ............................ 29/578 |

Primary Examiner—W. C. Tupman
Attorney, Agent, or Firm—J. C. Albrecht; W. K. Serp

[57] ABSTRACT

A silicon body (10) of a first conductivity type is covered with a sandwich of silicon dioxide (12), polycrystalline silicon (14) and silicon nitride (16). Source, drain, and interconnect work sites of the body are exposed by a first photoshaping operation. The work sites are doped forming regions (21, 22, 23) of a second conductivity type. Silicon dioxide (24, 26, 28) is grown over the work sites. A second photoshaping operation provides an opening 36. The walls of the opening 36 on two opposite sides comprise sides of the sandwich layer as established by the first photoshaping operation and the two remaining walls comprise sides of the silicon dioxide as established by the second photoshaping operation. Silicon nitride (44) is next deposited over the entire wafer (15) which is then photoshaped to define the field regions (46, 48). The etching process is continued to remove part of the silicon body as well as the sides of those exposed regions. Thereafter, silicon dioxide (47, 49) is grown in the field regions. The remaining silicon nitride layer is removed to reveal the underlying conductive polycrystalline silicon (14) at the gate region, the walls of the contact opening 36 and the interconnect region 23. A conductive material (51, 50) is deposited over the wafer (15) and then photoshaped to provide the desired pattern of ohmic interconnections.

5 Claims, 10 Drawing Figures

METHOD OF MANUFACTURING A DEVICE IN A SILICON WAFER

DESCRIPTION

1. Technical Field

This invention relates to a method of manufacture of an insulated gate field-effect transistor (IGFET) and to the structure of such a device.

2. Background Art

Integrated circuit arrangements which utilize IGFET devices can be rated on the basis of electrical performance of the devices e.g. on the basis of frequency response and electrical breakdown characteristics and on the basis of economy of wafer surface area.

Both electrical performance and surface area requirements are dependent on the method of formation of devices in the wafer. Where the method of manufacture involves successive masking steps which must be physically aligned there is expense involved in the control of these steps and in each such step a certain amount of additional surface area must be provided in recognition of attainable tolerances in mask alignment. There are prior arrangements which achieve a single self-alignment in the formation of the source and drain diffusions and the gate region of silicon gate IGFET devices; however, prior arrangements provide no further self-alignment of device elements.

DISCLOSURE OF THE INVENTION

The process of this invention is characterized by the following masking steps:
1—define regions in wafer to be electrically altered;
2—define contact areas to respective altered regions;
3—define wafer field as other than contact areas, the gate areas and the altered regions; and
4—define conductors.

Advantageously, in accordance with this invention, none of these masking steps need be critically aligned.

In the resulting IGFET structure there is full alignment between the gate electrode and the source and drain diffusions and alignment between the source and drain diffusions and their respective electrical contact regions. Additionally, the source and drain diffusions may be of uniform minimum width consistent with their electrical requirements since there is no need for allowance for possible misalignment of these diffusions and their respective electrical contact regions.

THE DRAWINGS

FIGS. 1 through 10, inclusive, illustrate selected steps during the fabrication of an insulated gate field-effect transistor (IGFET) in accordance with a preferred embodiment of this invention.

DETAILED DESCRIPTION

Figure 1:
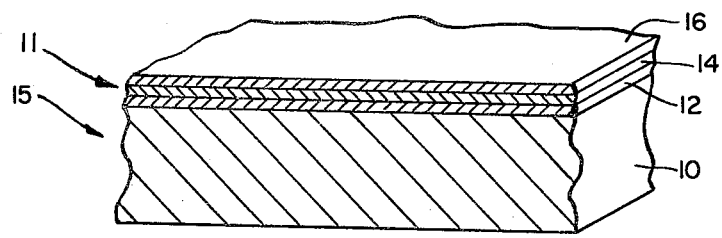

The method illustrated in FIGS. 1 to 10 is directed to an embodiment utilizing a P-type silicon body with N-type impurities as the dopant, that is, N-channel technology. The process steps disclosed are also applicable to P-type diffusions in combination with an N-type silicon body. As shown in FIG. 1, the surface of a silicon body 10, is covered with a silicon dioxide growth 12 produced by elevating the temperature of the body 10 in an environment containing oxygen. A portion of this silicon dioxide layer 12 will serve as the gate oxide for the final transistor. Alternately, although not shown herein, the material 12 may be any suitable gate insulator or sandwich of insulating materials.

A coating of conductive polycrystalline silicon material 14 is deposited over the entire wafer 15 to a thickness of approximately 500 to 6000 angstroms. Alternatively, polycrystalline silicon may be deposited and conductivity modifiers subsequently diffused therein to make that layer conductive. Further, any suitable conductor such as a refractory metal capable of sustaining the high temperatures to which the wafer 15 is subjected during the remaining process steps may be used. A portion of the polysilicon material 14 is used as a conductive electrode overlaying the gate oxide 12 in the transistor device. A masking medium 16 of silicon nitride ($Si_3N_4$) is deposited over the doped polysilicon 14 and serves as an oxidation, diffusion and etching barrier during the process steps.

Figure 2:
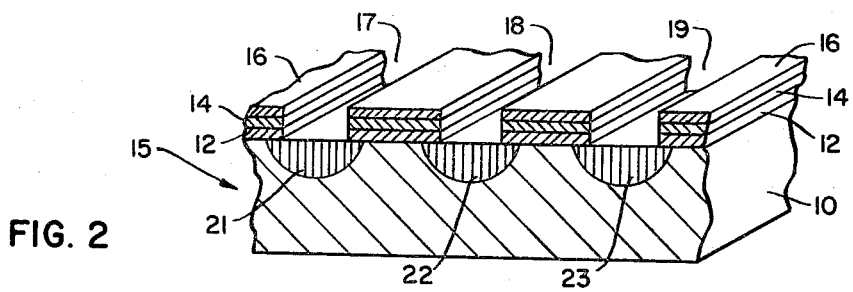
Figure 3:
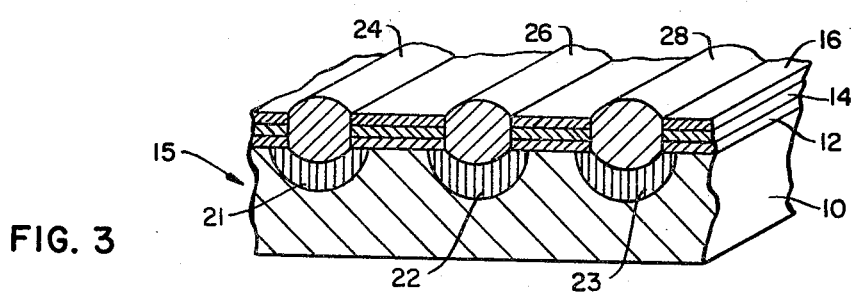

FIG. 2 illustrates certain steps performed for N-type diffusion of the source, drain and interconnect work sites 17, 18, and 19. Photoresist material is placed over the silicon nitride layer 16. A lithographic mask defining the desired diffusion pattern is used to delineate the selected portions of the resist overlaying the desired work sites. The nitride layer 16 located over the work sites is removed by etching the surface of the wafer 15 with a suitable etchant. The etchant quickly dissolves the silicon nitride layer 16 but attacks the polysilicon 14 and silicon dioxide 12 at much slower rates. During the subsequent etching steps, the photoresist material may be removed since the silicon nitride 16 serves as an effective etchant barrier. The surface of the wafer 15 is subjected to a sequence of solutions which remove the polysilicon 14 and silicon dioxide 12 thus exposing the work sites 17, 18, and 19. An N-type diffusion is produced in the exposed work sites 17, 18, and 19 by subjecting the wafer 15, under elevated temperature conditions, to a gas environment containing arsenic phosphorous or any other suitable dopant. Alternatively, an ion implantation process may be employed.

Silicon dioxide 24, 26, and 28 is grown over the diffusions 21, 22, and 23 to seal the diffusion regions 21, 22, and 23 and to allow conductor crossover. Although the exact thickness of the silicon dioxide growth is not critical, the thickness should be sufficient to fill the openings over the work sites 17, 18, and 19. As is well-known, the growth of the silicon dioxide 24, 26, and 28 forces the N-type material deeper into the P-type body 10 as first illustrated in FIG. 3.

Figure 4:
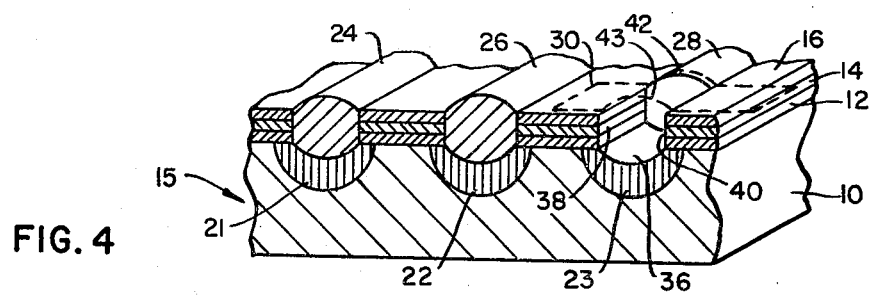

With particular reference to FIG. 4, a second lithographic mask is applied over the surface of the wafer 15. The second mask defines a selected area 30 which includes that portion of the diffusion region 23 whereat electrical "ohmic" contact with the N-type material is to be made. After application of the mask, the entire wafer 15 is exposed to an etchant which removes the defined portion of the silicon dioxide 28 thus providing an opening 36 to the diffusion region 23. The layer of silicon nitride material 16, within the area 30, resists the etchant as does the resist covering the remainder of the wafer 15. Two opposite walls 38 and 40 of the opening 36 are defined by the first photomask which also defined the work sites 17, 18, and 19. The position of the remaining opposing walls 42 and 43 of the opening 36 are established by the second photomask. This particular masking arrangement eliminates a critical photomask registration problem experienced with prior fabrication processes. Since the location of the walls 38 and 40 are completely determined by the silicon nitride layer and not the second photomask, the width of the opening 30 defined by the second photomask may conveniently be made larger than the width of the interconnect diffusion region 23 without increasing the size of the opening 36. Prior fabrication processes have generally provided an enlarged contact area to accommodate possible misalignment of the successive photomasks.

Figure 5:
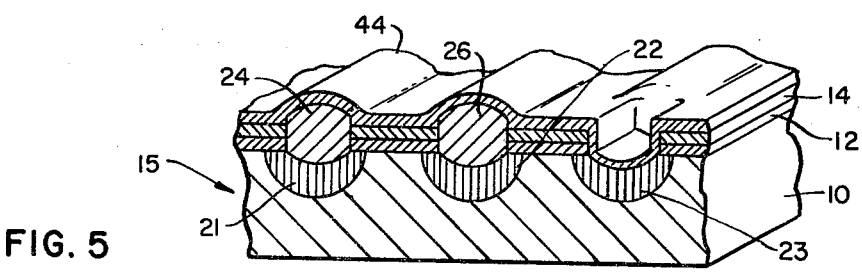
Figure 6:
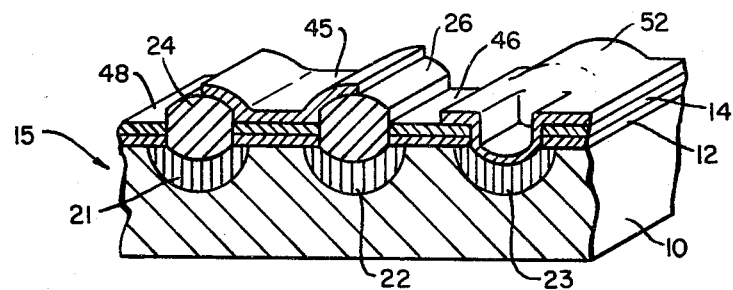

A second layer of silicon nitride ($Si_3N_4$) 44 is deposited over the entire surface of the wafer 15 as illustrated in FIG. 5 to protect the contact area 36. A third photomask is used to photoshape the wafer 15. As shown in FIG. 6, this third photoshaping process includes the gate region 45 as well as a diffusion contact region 52. It will be appreciated that none of the edges produced by this third photoshaping step are required to be in close alignment with any of the edges defined by either the first or second photoshaping steps. The gate region 45 and diffusion contact region 52 defined by the third photoshaping can be slightly oversized to facilitate positioning on the wafer 15 without increasing the overall area occupied by the resulting transistor.

Figure 7:
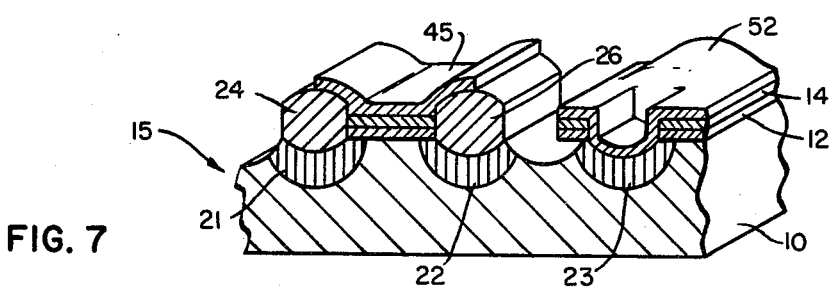
Figure 8:
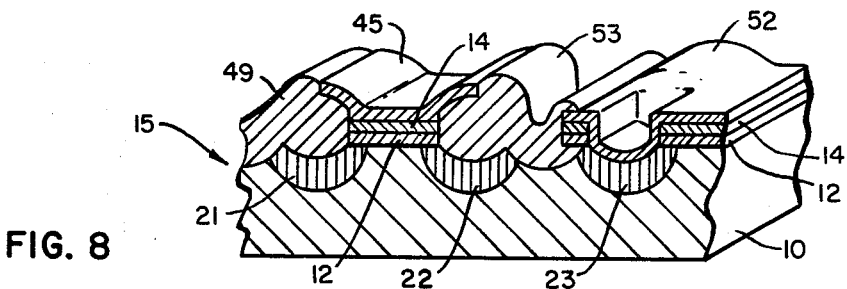

The portions of the layer of nitride material 44 (FIG. 5) not protected by the third photomask are removed during the third photoshaping operation by a suitable etching thereby exposing the underlying field areas 46 and 48 of the polysilicon 14 as well as the portions of the silicon oxide 24 and 26 grown over the diffusions 21 and 22. The etching portion of the third photoshaping step may be stopped at the surface of the polysilicon 14 as shown in FIG. 6 and the field areas 46 and 48 oxidized. Preferably, the etching operation is continued, as illustrated in FIG. 7, well into the silicon body 10 and the diffusion regions 21 and 22 thereby reducing the size of the side walls of the diffusions. These side walls do not contribute to the operation of the resulting transistor and their removal reduces the diffusion region to silicon body capacitance of the transistor which increases the maximum operating frequency of the transistor. Upon completion of the etching process, a protective layer of silicon dioxide 49 and 53 is grown or deposited over the exposed portion of the silicon body 10 by elevating the temperature of the wafer 15 and by subjecting it to an atmosphere containing oxygen. As illustrated in FIG. 8, the growth of the silicon dioxide 49 and 53 further reduces the inter-element capacitances as the growth oxidizes portions of the side walls of the diffusion regions 21 and 22.

Figure 9:
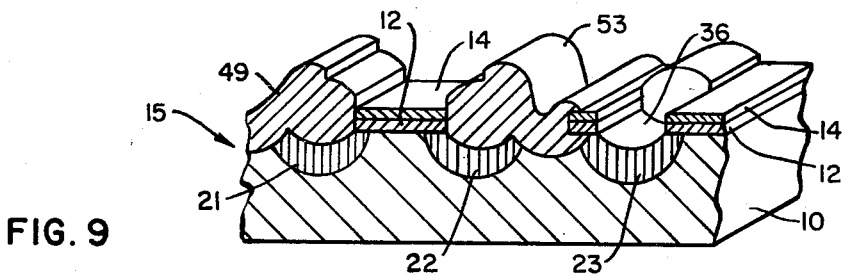
Figure 10:
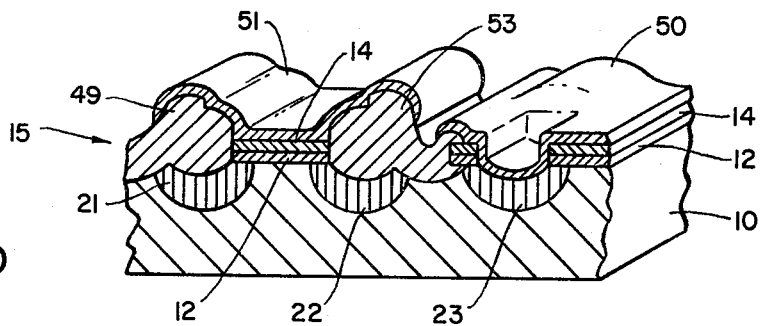

With reference to FIG. 9, the nitride layers 45 and 52 are removed with a suitable etchant thereby exposing portions of the conductive polysilicon layer 14 covering the gate oxide 12 and the interconnect diffusion region 23. In the event the polysilicon layer 14, when initially applied, was not doped to conduction it may now be doped by means well-known in the art. The exposed portion of the interconnect diffusion 23 may be further doped at this time to modify its resistivity and/or junction depth.

As a final step, the surface of the wafer 15 is covered with aluminum by evaporative techniques well-known in the art. Thereafter, the surface of the wafer 15 is photoshaped with a fourth mask which delineates the locations whereat metallic "ohmic" conductors 50 and 51 are to remain. The positioning of the fourth mask is not particularly critical since the main consideration is that the metallic conductor 51 contact at least a portion of the polysilicon gate electrode 14 in the gate region and the metallic conductor 50 contact a portion of the diffusion region 23.

The disclosed IGFET fabrication process produces a device exhibiting minimum physical dimensions without the necessity of observing extreme photomask registration tolerances. Further, parasitic capacitances have been greatly reduced resulting in a relatively high transistor upper frequency limit. Although the invention has been particularly shown and described with reference to a preferred implementation thereof, it should be understood that various changes in form and detail may be made without departing from the spirit and scope of the invention.

What is claimed is:

1. A method of manufacturing a device in a silicon wafer (15) of a first conductivity type having formed thereon a masking medium (11) having an oxygen impervious exposed surface, masking and removing selected portions of the masking medium to expose the surface of the wafer to define at least one pair of spaced apart work sites (17, 18, 19), each of the work sites being doped to form regions (21, 22, 23) of a second conductivity type, and placing an oxide layer (24, 26, 28) over the altered regions and over any other exposed surface capable of being oxidized, characterized by:
   1—masking the surface of the wafer to define an electrical contact area over a selected portion of at least one of said second conductivity type regions;
   2—removing that portion of the oxide in the defined area thus producing an opening (36) to the underlying doped region (23) whereby at least one wall of the opening is defined by an edge of said masking medium as previously defined by said first mentioned masking step and any remaining wall of the opening is defined by the oxide (28) formed over the doped region (23) as defined by said second mentioned masking step;
   3—covering the entire exposed surface of the wafer with an oxygen impervious masking layer (44);
   4—removing selected portions of the masking medium (11) and of the oxygen impervious masking layer (44) while retaining that portion of the masking layer (44) overlaying the doped region (23) defined by said opening, to define field regions (46, 48) whereat the wafer (15) is to be covered with a field oxide (49, 53);
   5—forming a field oxide (49, 53) over the field regions of the wafer (15);
   6—removing the remaining oxygen impervious surface regions (45, 52);
   7—forming a conductor over the entire surface of the wafer; and
   8—removing the conductor from all undesired portions of the surface to form a desired pattern of electrical interconnection which at least overlays a portion of the doped region defined by said opening.

2. The method of claim 1 which further includes the step of removing a portion of the body of the wafer 15 and portions of any adjacent doped regions (21, 22) after step 4 and before step 5.

3. The method of claim 1 wherein said masking medium (11) over the surface of the wafer comprises a sandwich including a layer (12) of silicon dioxide placed adjacent the surface of the wafer, a layer (14) of polycrystalline silicon material over the surface of the silicon dioxide layer, and an exposed oxygen impervious layer (16) of silicon nitride (16).

4. The method of claim 3 where in step 6 only the silicon nitride layer (16) of said masking medium (11) is removed and at least one of the conductors (51) formed in step 8 is formed in contact with the layer (14) of polycrystalline silicon over the gate area of the transistor.

5. The method of claim 4 which further includes the step of treating the polycrystalline silicon material (14) exposed in the gate area with a dopant to render it conductive.

* * * * *